US012604711B2

(12) United States Patent
Shih

(10) Patent No.: US 12,604,711 B2
(45) Date of Patent: Apr. 14, 2026

(54) SEMICONDUCTOR DEVICE AND MANUFACTURING METHOD THEREOF

(71) Applicant: NANYA TECHNOLOGY CORPORATION, New Taipei City (TW)

(72) Inventor: Shing-Yih Shih, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 571 days.

(21) Appl. No.: 17/664,218

(22) Filed: May 19, 2022

(65) Prior Publication Data

US 2023/0377885 A1     Nov. 23, 2023

(51) Int. Cl.
*H01L 21/027* (2006.01)
*H01L 21/02* (2006.01)
*H01L 21/768* (2006.01)
(52) U.S. Cl.
CPC .... *H01L 21/0273* (2013.01); *H01L 21/02016* (2013.01); *H01L 21/02697* (2013.01); *H01L 21/76897* (2013.01)
(58) Field of Classification Search
None
See application file for complete search history.

(56) References Cited

U.S. PATENT DOCUMENTS

| | | | | |
|---|---|---|---|---|
| 10,607,924 B1* | 3/2020 | Chiu | | H01L 23/5383 |
| 2012/0074584 A1* | 3/2012 | Lee | | H01L 23/481 |
| | | | | 257/E21.597 |
| 2014/0232013 A1* | 8/2014 | Wu | | H01L 23/528 |
| | | | | 438/638 |
| 2016/0371417 A1* | 12/2016 | Chun | | G06F 30/394 |
| 2017/0053902 A1* | 2/2017 | Yu | | H01L 23/481 |
| 2022/0415930 A1* | 12/2022 | Chuang | | H01L 27/1207 |

FOREIGN PATENT DOCUMENTS

TW          202133401 A      9/2021

* cited by examiner

*Primary Examiner* — Sue A Purvis
*Assistant Examiner* — Jordan M Klein
(74) *Attorney, Agent, or Firm* — CKC & Partners Co., LLC

(57) ABSTRACT

A method of manufacturing a semiconductor device includes bonding a first wafer with a second wafer. The second wafer includes a substrate, an isolation structure in the substrate, a transistor on the substrate, and a interconnect structure over the second transistor. A first etching process is performed to form a first via opening and a second via opening in the substrate. The second via opening extends to the isolation structure, and the second via opening is deeper than the first via opening. A second etching process is performed such that the first via opening exposes the substrate. A third etching process is performed such that the first via opening and the second via opening exposes the interconnect structure, and the second via opening penetrates the isolation structure. A first via is formed in the first via opening and a second via is formed in the second via opening.

9 Claims, 15 Drawing Sheets

100

200

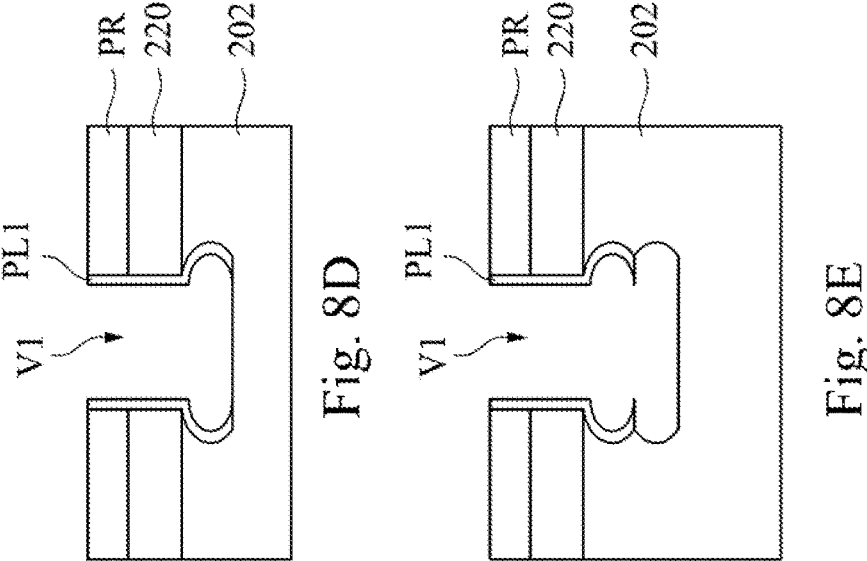
Fig. 8D
Fig. 8E
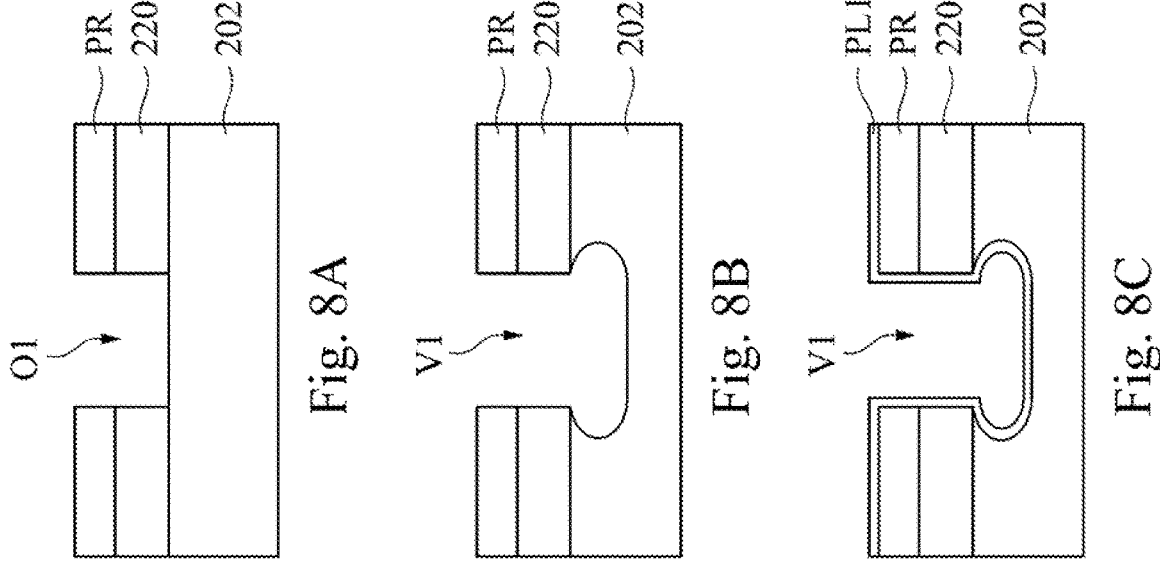
Fig. 8A
Fig. 8B
Fig. 8C

SEMICONDUCTOR DEVICE AND MANUFACTURING METHOD THEREOF

BACKGROUND

Field of Disclosure

The present disclosure relates to a semiconductor device and a manufacturing method thereof.

Description of Related Art

The through substrate vias may be used to connect a semiconductor chip to another semiconductor chip or to a package substrate. For example, through substrate vias may be used in various semiconductor devices such as an image sensor, a stacked memory, or an interposer. A connection method using through substrate vias may be advantageous in terms of speed, power consumption, and/or miniaturization compared to a connection method using wire bonding.

SUMMARY

It is to be understood that both the foregoing general description and the following detailed description are by examples, and are intended to provide further explanation of the disclosure as claimed.

Some embodiments of the present disclosure provides a method of manufacturing a semiconductor device including bonding a first wafer with a second wafer. The second wafer includes a substrate, an isolation structure embedded in the substrate, a transistor on the substrate, and a interconnect structure over the transistor. A first etching process is performed to form a first via opening and a second via opening in the substrate. The second via opening extends to the isolation structure, the transistor is between the first via opening and the second via opening, and the second via opening is deeper than the first via opening. A second etching process is performed such that the first via opening extends to a bottom of the substrate. A third etching process is performed such that the first via opening and the second via opening exposes the interconnect structure, and the second via opening penetrates the isolation structure. A first via is formed in the first via opening and a second via is formed in the second via opening.

In some embodiments, the second via opening is wider than the first via opening.

In some embodiments, before performing the first etching process, the method further includes grinding the substrate of the second wafer at a backside surface of the substrate of the second wafer, and forming a dielectric layer at the backside surface of the substrate.

In some embodiments, the method further includes forming a photoresist layer at a backside surface of the substrate of the second wafer. The photoresist layer includes a first opening and a second opening, and the first opening is narrower than the second opening. The first etching process is performed to form the first via opening connecting the first opening of the photoresist layer and the second via opening connecting the second opening of the photoresist layer.

In some embodiments, the method o further including forming a liner layer along sidewalls of the first via opening and the second via opening after performing the third etching process and before forming the first via and the second via.

In some embodiments, forming the first via and the second via includes depositing a conductive material in the first via opening and the second via opening and over the second wafer, and planarizing the second wafer to remove an excess portion of the conductive material to form the first via and the second via.

In some embodiments, the first etching process etches the substrate faster than the isolation structure.

In some embodiments, the first etching process and the second etching process use the same etchant gas.

In some embodiments, a depth of the second via opening remains the same during the second etching process.

In some embodiments, performing the first etching process to form the first via opening includes forming the first via opening in the substrate by a photoresist layer having an opening, forming a passivation layer along sidewalls and a bottom surface of the first via opening, removing the passivation layer at the bottom surface of the first via opening, etching the bottom of the first via opening to deepen the first via opening, and repeating forming the passivation layer, removing the passivation layer at the bottom surface of the first via opening and etching the bottom of the first via opening until the bottom of the first via opening reached a predetermined level.

Some embodiments of the present disclosure provides a semiconductor device including a first wafer, a second wafer, a first via and a second via. The second wafer is bonded to the first wafer, and the second wafer includes a substrate, an isolation structure embedded in the substrate, a transistor between the substrate and the first wafer, and an interconnect structure between the transistor and the first wafer. The first via is in a central region of the second wafer and in contact with the interconnect structure. The second via is in a peripheral region of the second wafer and in contact with the interconnect structure, and the isolation structure partially surrounds the second via.

In some embodiments, the second via is wider than the first via.

In some embodiments, the first via includes a first portion and a second portion under the first portion, and the second portion is narrower than the first portion.

In some embodiments, a height of the second portion of the first via is greater than a height of a source/drain region of the second transistor.

In some embodiments, the semiconductor device further includes a liner layer wrapped around the second via.

In some embodiments, the liner layer is in contact with both the substrate and the isolation structure.

In some embodiments, the semiconductor device further includes a dielectric layer over the substrate and surrounding the first via and the second via.

Some embodiments of the present disclosure provide a semiconductor device, including a first wafer, a second wafer, a power via and a signal via. The second wafer is over the first wafer, and the second wafer includes a substrate, an isolation structure in the substrate, a first transistor and a second transistor adjacent the isolation structure, and an interconnect structure between the substrate and the first wafer. The power via penetrated the substrate and the isolation structure to the interconnect structure. The signal via penetrating the substrate to the interconnect structure, wherein the signal via is between the first transistor and the second transistor but spaced apart from the isolation structure.

In some embodiments, the signal via comprises a first portion and a second portion between the first portion and the interconnect structure, and the first portion is wider than the second portion.

In some embodiments, a top of the second portion is higher than a top of the isolation structure.

The present disclosure of is related to a method of controlling the etching rate difference of via openings with different width. For example, an isolation structure may be used as a etch stop layer for the via opening with greater width. Therefore, the etching time difference between the via openings with different width may be reduced. Moreover, the signal via in some embodiments has a narrow bottom portion. The transistors are less easily affected by the signal via, and the transistors may be arranged densely. Therefore, the number of transistors per area increases.

The manufacturing method of the semiconductor device in some embodiments of the present disclosure may control the etching rate difference of via openings with different width. Therefore, the etching time difference between the via openings with different width may be reduced. Moreover, the narrow second portion of the signal via makes the signal via affect transistors less.

BRIEF DESCRIPTION OF THE DRAWINGS

The disclosure can be more fully understood by reading the following detailed description of the embodiment, with reference made to the accompanying drawings as follows:

FIGS. 8A-8E illustrate a detailed mechanism of the first etching process in region M in FIG. 7.

DETAILED DESCRIPTION

Figure 1A:
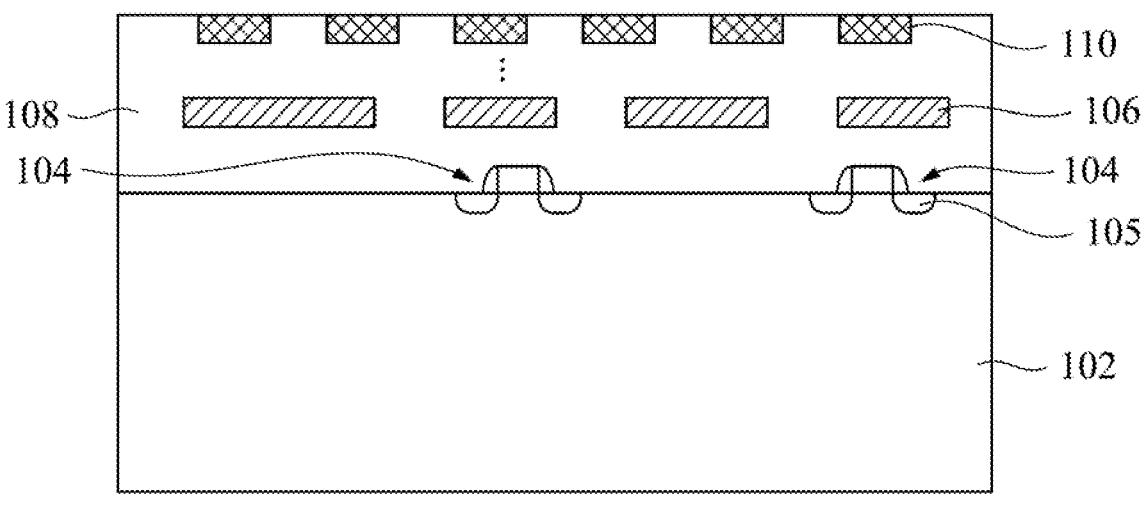
FIGS. 1A-7 illustrate cross-sectional views of intermediate stages in the manufacturing process of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure is related to a method of controlling the etching rate difference of via openings with different width. Therefore, vias having different widths are formed in the semiconductor device, and vias having different widths may be used for different usage.

FIGS. 1A-7, 9, 11-14 illustrate cross-sectional views of intermediate stages in the manufacturing process of a semiconductor device in accordance with some embodiments of the present disclosure. Referring to FIG. 1A, a first wafer 100 is provided. The first wafer 100 may include a substrate 102, transistors 104, a interconnect structure 106, a dielectric layer 108 and bonding pads 110. The substrate 102 may include any suitable materials, such as semiconductor materials (e.g. silicon). The transistors 104 are disposed on the substrate 102, and the transistors 104 include source/drain regions 105 in the substrate 102. The interconnect structure 106 are used to provide electrical interconnection between the transistors 104 and are made of conductive materials. The interconnect structure 106 is over the transistors 104. In some embodiments, the interconnect structure 106 is a multi-layer structure include conductive vias and conductive lines. The conductive vias may connect the conductive lines in different level to form the interconnect structure 106. The dielectric layer 108 covers the substrate 102, the transistors 104 and the interconnect structure 106 to electrically isolate adjacent conductive vias and conductive lines in the interconnect structure 106. The dielectric layer 108 may be made of any suitable material. In some embodiments, the dielectric layer 108 is made of $SiO_2$, SiC, low-k materials, or the like. The bonding pads 110 may be disposed over the interconnect structure 106, and the bonding pads 110 may be electrically connect to the interconnect structure 106.

Figure 1B:
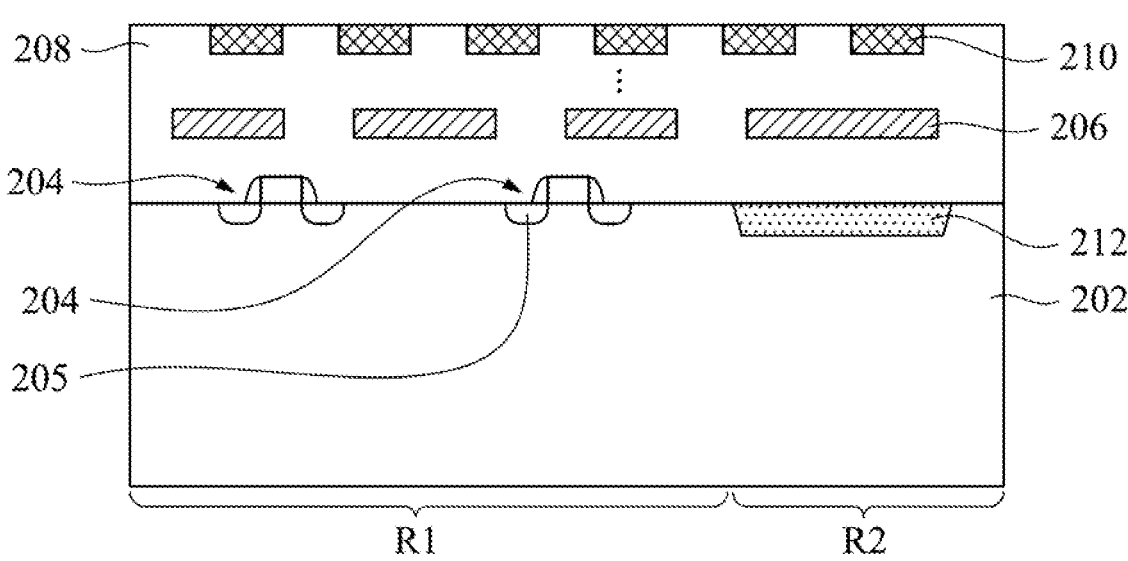

Referring to FIG. 1B, a second wafer 200 is provided. The second wafer 200 may include a substrate 202, transistors 204, a interconnect structure 206, a dielectric layer 208, bonding pads 210, and an isolation structure 212. The transistors 204 are disposed in a central region R1 of the substrate 202, and the isolation structure 212 is embedded in a peripheral region R2 of the substrate 202. The term "central region" herein refers to the region where transistors 204 are densely formed, and the term "peripheral region" refers to the region surrounding the central region. The peripheral region R2 is farther from the transistors 204. The isolation structure 212 may be formed of any suitable dielectric material, such as $SiO_2$, and material of the isolation structure 212 is different from the substrate 202. The substrate 202, the transistors 204, the source/drain regions 205, the interconnect structure 206, the dielectric layer 208 and the bonding pads 210 are similar to or the same as the substrate 102, the transistors 104, the source/drain regions 105 the interconnect structure 106, the dielectric layer 108 and the bonding pads 110, respectively; therefore, detailed descriptions are not discussed herein.

Figure 2:
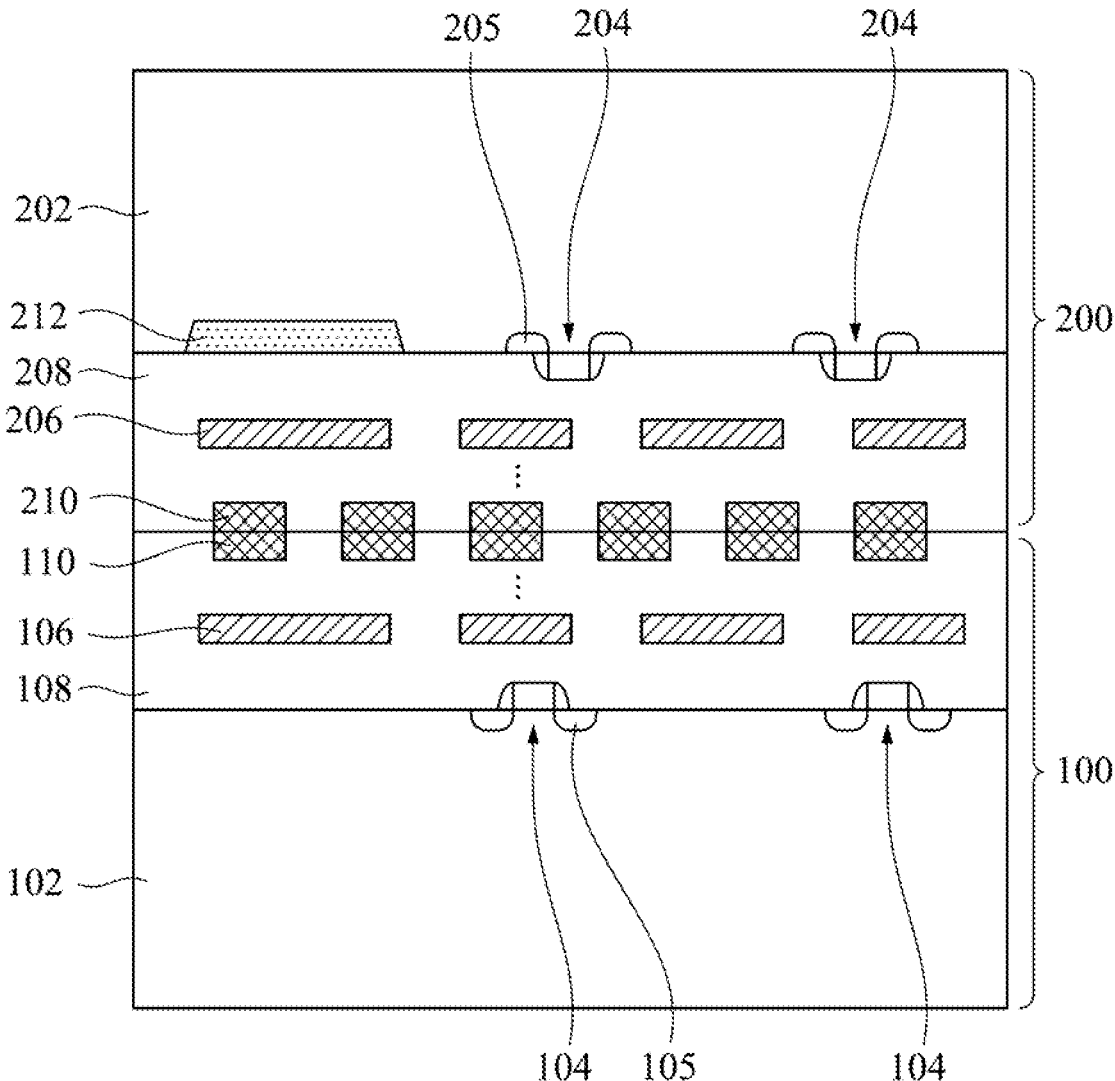

Referring to FIG. 2, a hybrid bonding process is performed, and the first wafer 100 is bonded with the second wafer 200. During the hybrid bonding process, the second wafer 200 is flipped upside down and disposed over the first wafer 100 to form a semiconductor device. The front-side surface of the first wafer 100 is bonded with the front-side surface of the second wafer 200 such that the bonding pads 110 are bonded to the bonding pads 210, respectively. Moreover, the dielectric layer 108 of the first wafer 100 is also bonded to the dielectric layer 208 of the second wafer 200. After the first wafer 100 is bonded with the second wafer 200, the isolation structure 212 is still in the peripheral region of the substrate 202.

Figure 3:
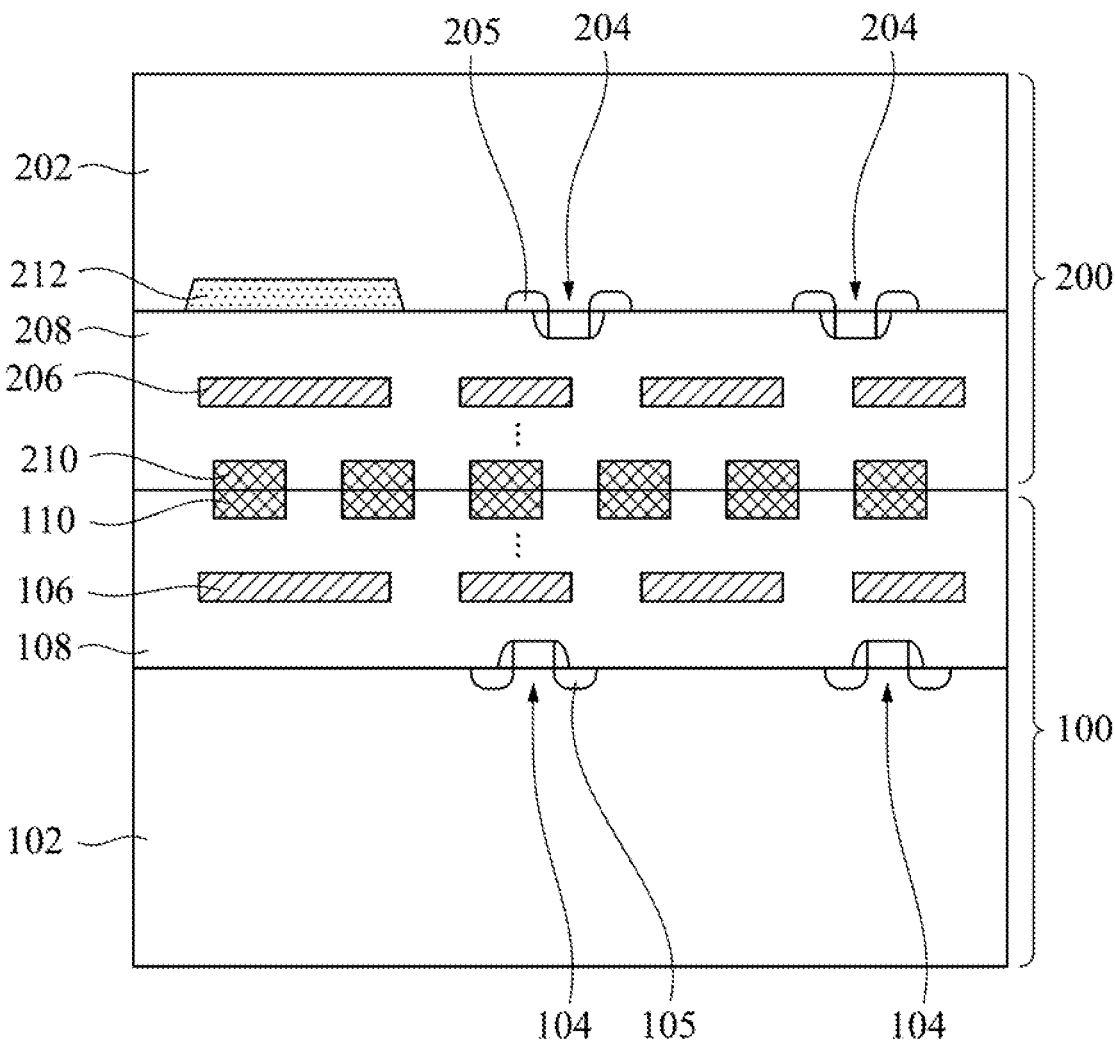
Figure 4:
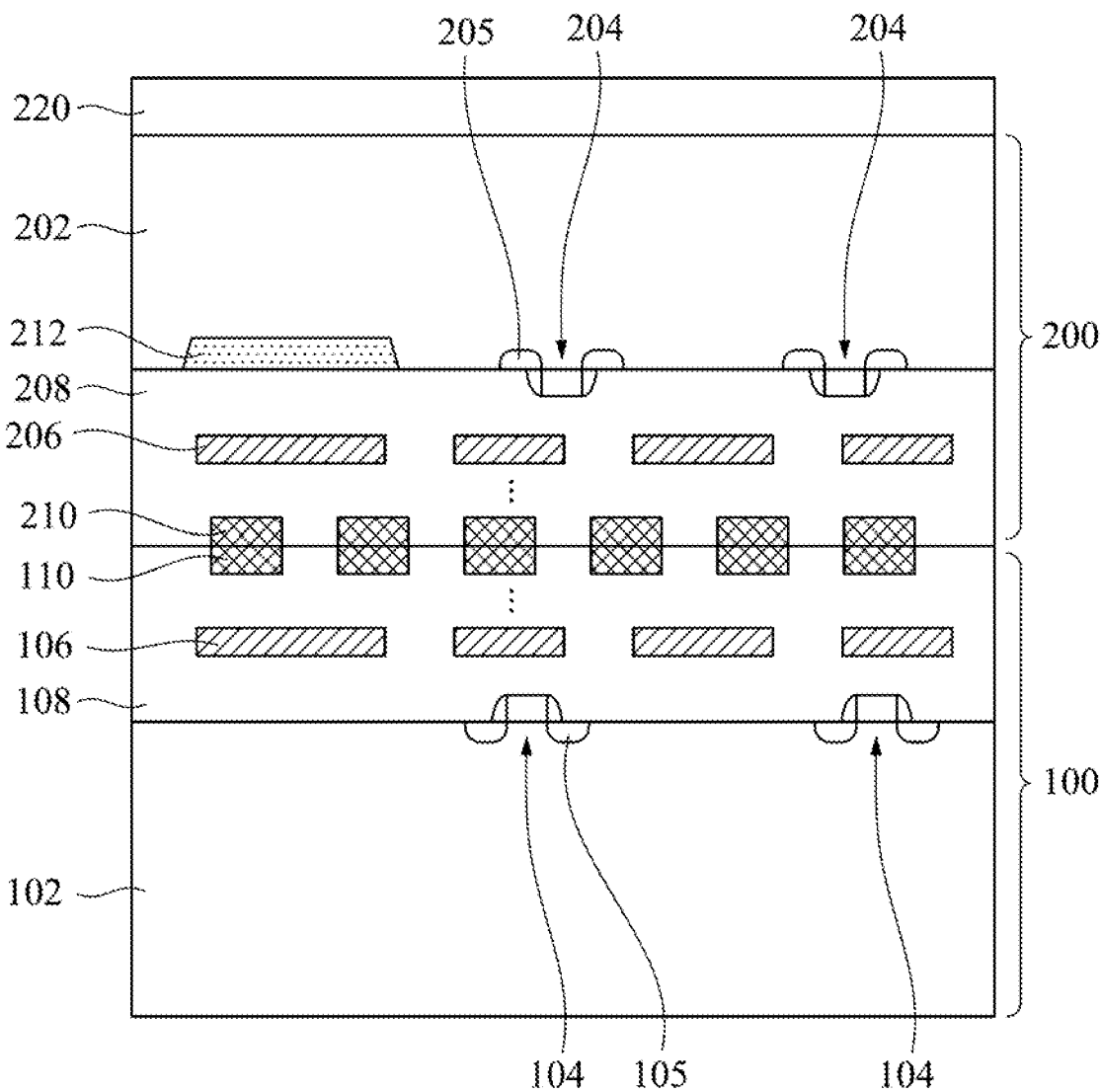

Referring to FIG. 3, the substrate 202 of the second wafer 200 is grinded at a backside surface of the substrate 202 of the second wafer 200. The substrate 202 may be grinded by any suitable method, such as chemical mechanical polish. Referring to FIG. 4, a dielectric layer 220 is formed at the backside surface of the substrate 202. In some embodiments, the dielectric layer 220 is formed of $SiO_2$, SiN, SiCN, SiC, combinations thereof, or the like.

Figure 5:
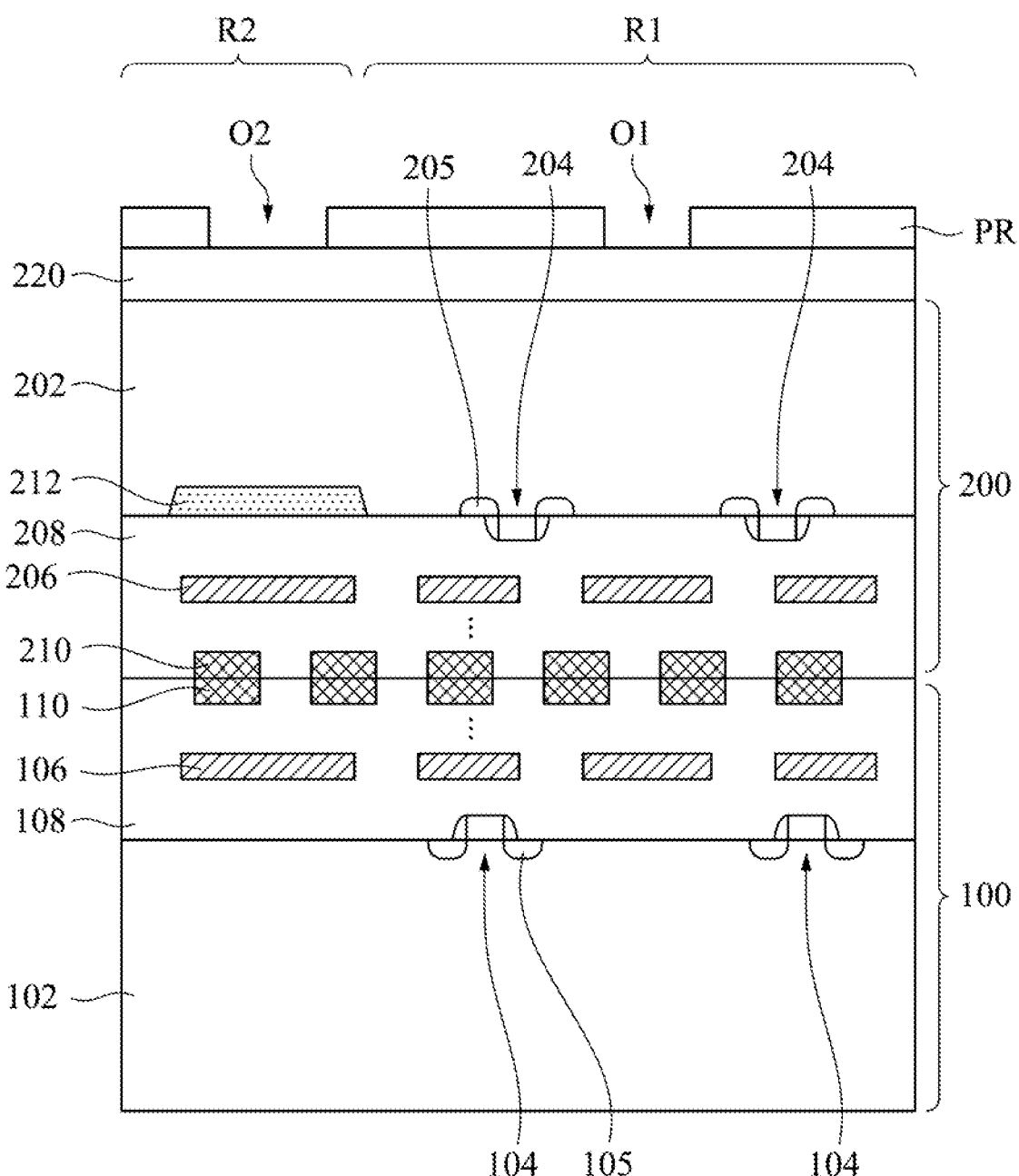

Referring to FIG. 5, a photoresist layer PR is formed at the backside surface of the substrate 202 of the second wafer 200. More specifically, a photoresist material is first disposed over the backside surface of the substrate 202 of the second wafer 200. Subsequently, a photolithography process is performed to form the photoresist layer PR with patterns. The photoresist layer PR includes a first opening O1 and a second opening O2, and the first opening O1 is narrower than the second opening O2. The first opening O1 is formed over the central region R1 of the substrate 202, but not directly over the transistors 104 and the transistors 204. The second opening O2 is formed over the peripheral region R2 of the substrate 202, and is directly over the isolation structure 212. In some embodiments, the first openings O1 may be arranged in an array. The first openings O1 and the second opening O2 expose the dielectric layer 220.

Figure 6:
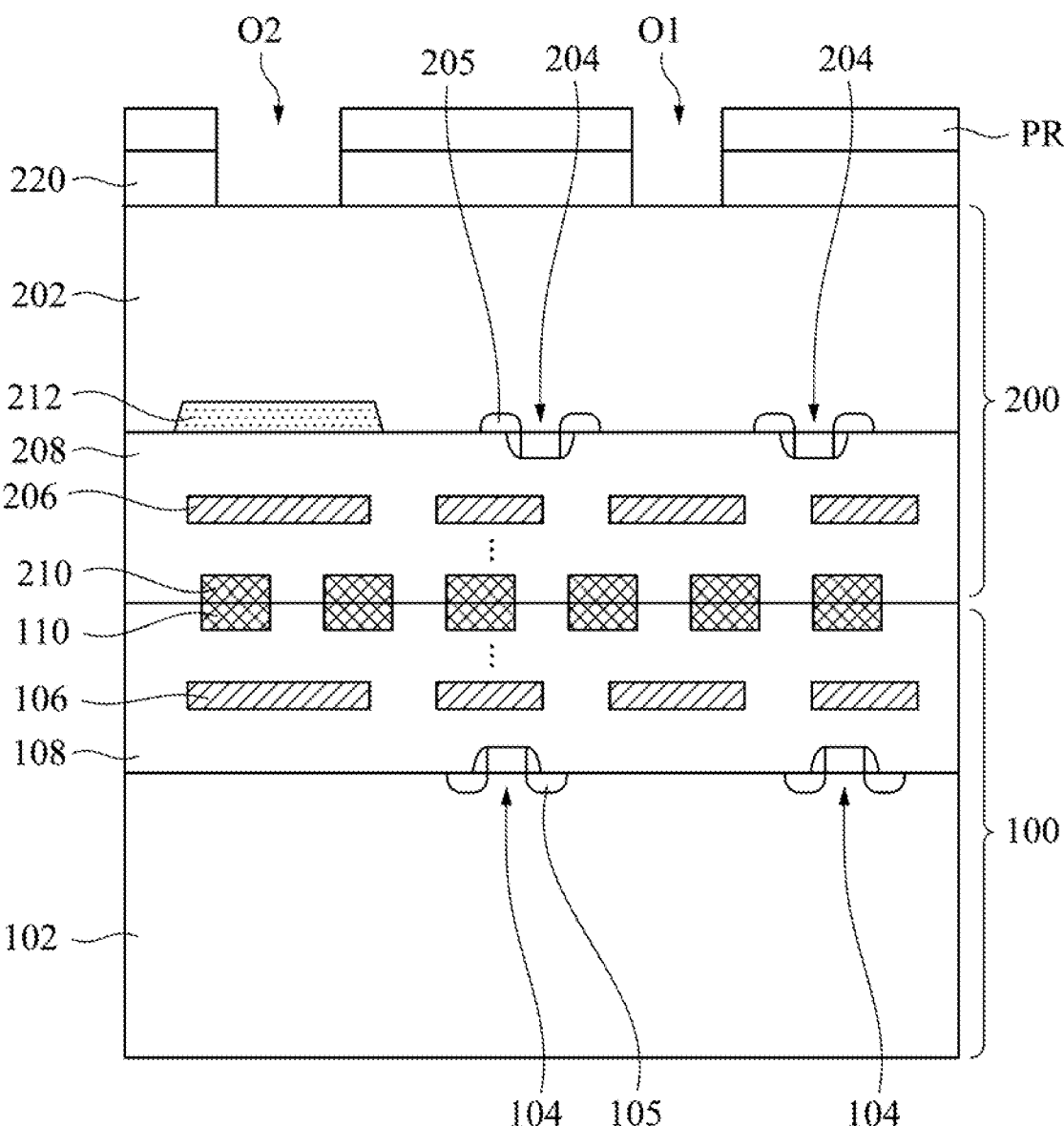

Referring to FIG. 6, the first opening O1 and the second opening O2 are extended into the dielectric layer 220. More specifically, the dielectric layer 220 is etched by using the photoresist layer PR as a mask. The first opening O1 and the second opening O2 expose the substrate 202 of the second wafer 200.

Figure 7:
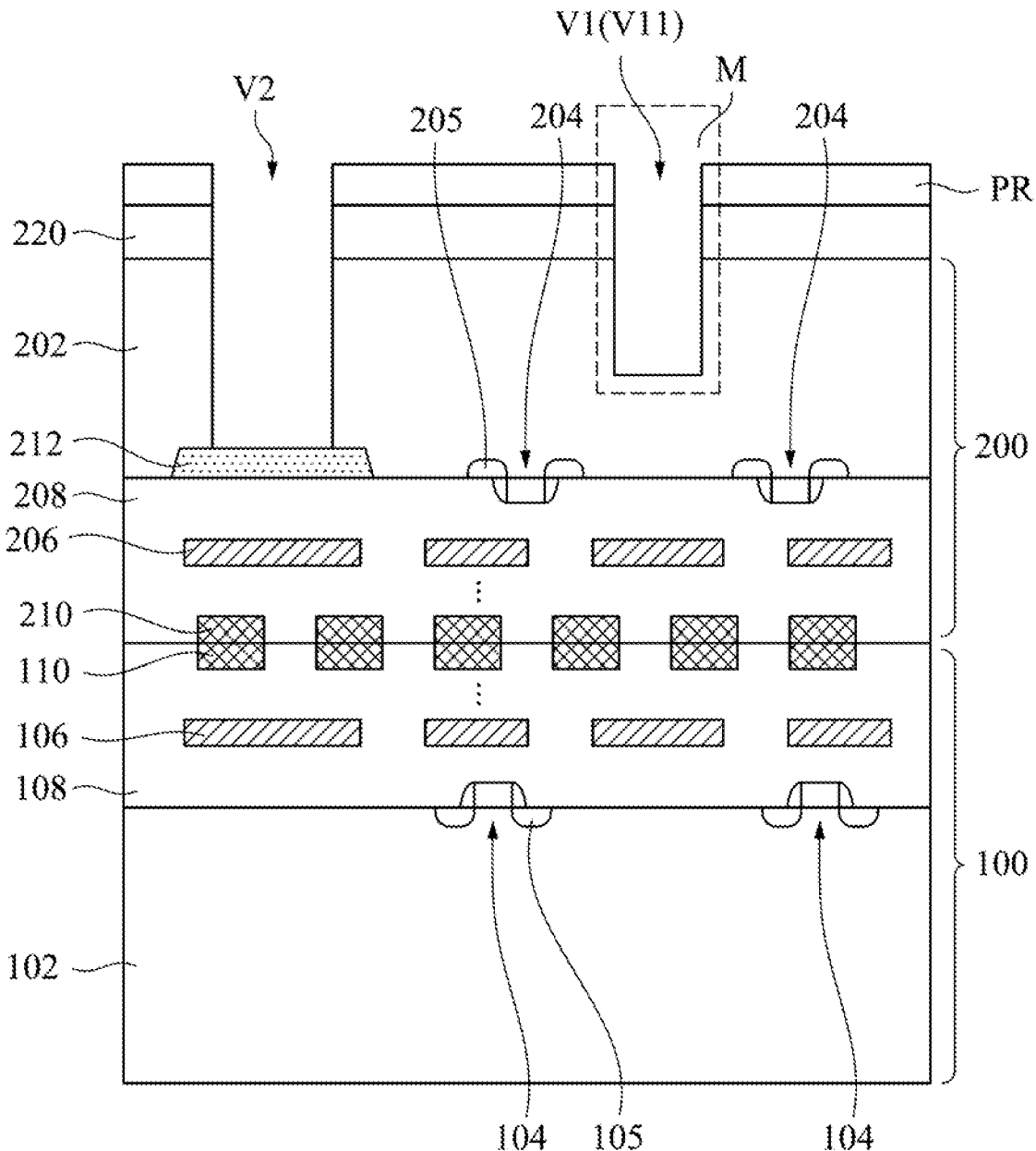

Referring to FIG. 7, a first etching process is performed to form a first via opening V1 and a second via opening V2 in the substrate 202. The second via opening V2 extends to the isolation structure 212, the transistor 204 is between the first via opening V1 and the second via opening V2, and the second via opening V2 is deeper than the first via opening V1. In FIG. 7, a first portion V11 of the first via opening V1 is formed.

More specifically, the first etching process is performed by using the photoresist layer PR with the patterned dielectric layer 220 as a mask. Therefore, the first via opening V1 connects to the first opening O1 of the photoresist layer PR, and the second via opening V2 connects to the second opening O2 of the photoresist layer PR. Since the second opening O2 is wider than the first opening O1, the second via opening V2 is wider than the first via opening V1. The width difference between the second via opening V2 and the first via opening V1 leads to loading effect during the first etching process, and the loading effect leads to the etching rate difference between the second via opening V2 and the first via opening V1. Since the etching gas moves to the bottom of the wider opening more easily, the wider opening, such as second via opening V2, is etched at a faster etching rate than the narrower opening, such as first via opening V1. When the bottom of the second via opening V2 reaches and exposes the isolation structure 212, the bottom of the first via opening V1 is higher than the second via opening V2. That is, the first via opening V1 is shallower than the second via opening V2. The isolation structure 212 is made of the material different from the substrate 202. Therefore, the isolation structure 212 is able to stop the etching of the second via opening V2, while the etching of the first via opening V1 continues until the bottom of the first via opening V1 reaches a predetermined level. In other words, the first etching process etches the substrate 202 faster than the isolation structure 212. The first via opening V1 does not expose the substrate 202 during the first etching process.

FIGS. 8A-8E illustrate a detailed mechanism of the first etching process in region M in FIG. 7. It is noted that, although FIGS. 8A-8E take the first via opening V1 as example, the second via opening V2 is also formed by the similar method. Referring to FIGS. 8A and 8B, the substrate 202 is etched through the opening O1 of the photoresist layer PR to form the first via opening V1 in the substrate 202. The substrate 202 is etched by an etchant gas, such as $SF_6$. The duration of the process in FIG. 8B is short and the depth of the first via opening V1 in FIG. 8B is shallow. However, the first etching process also laterally etches the substrate 202, such that the width of the first via opening V1 is wider than the first opening O1. Referring to FIG. 8C, subsequently, a passivation layer PL1 is formed along the sidewall of the dielectric layer 220 and the photoresist layer PR, and the sidewall and the bottom surface of the first via opening V1. The passivation layer PL is formed by using a deposition gas different from the etching gas used in FIG. 8B, and the chemicals in the deposition gas react to each other to form a polymer liner along the sidewall of the first via opening V1, the dielectric layer 220 and the photoresist layer PR. The polymer liner layer may be the passivation layer PL1. In some embodiments, the deposition gas may be fluorine-containing gas, such as $C_4F_8$, or $C_5HF_7$. Referring to FIG. 8D, the passivation layer PL1 at the bottom surface of the first via opening V1 and the top of the photoresist layer PR is removed by the etching gas used in FIG. 8B. Subsequently, the substrate 202 exposed at the bottom surface of the first via opening V1 is etched and the first via opening V1 is deepened. The etching process in FIG. 8E is same as that in FIG. 8B. Forming the passivation layer PL1, removing the passivation layer PL1 at the bottom surface of the first via opening V1 and etching the bottom surface of the first via opening V1 are repeated until the bottom of the first via opening V1 reaches a predetermined level. The passivation layer PL1 in FIG. 8C may serve as a mask at the vertical sidewall of the first via opening V1, such that the first via opening V1 in FIG. 8D is etched vertically but not horizontally.

Figure 9:
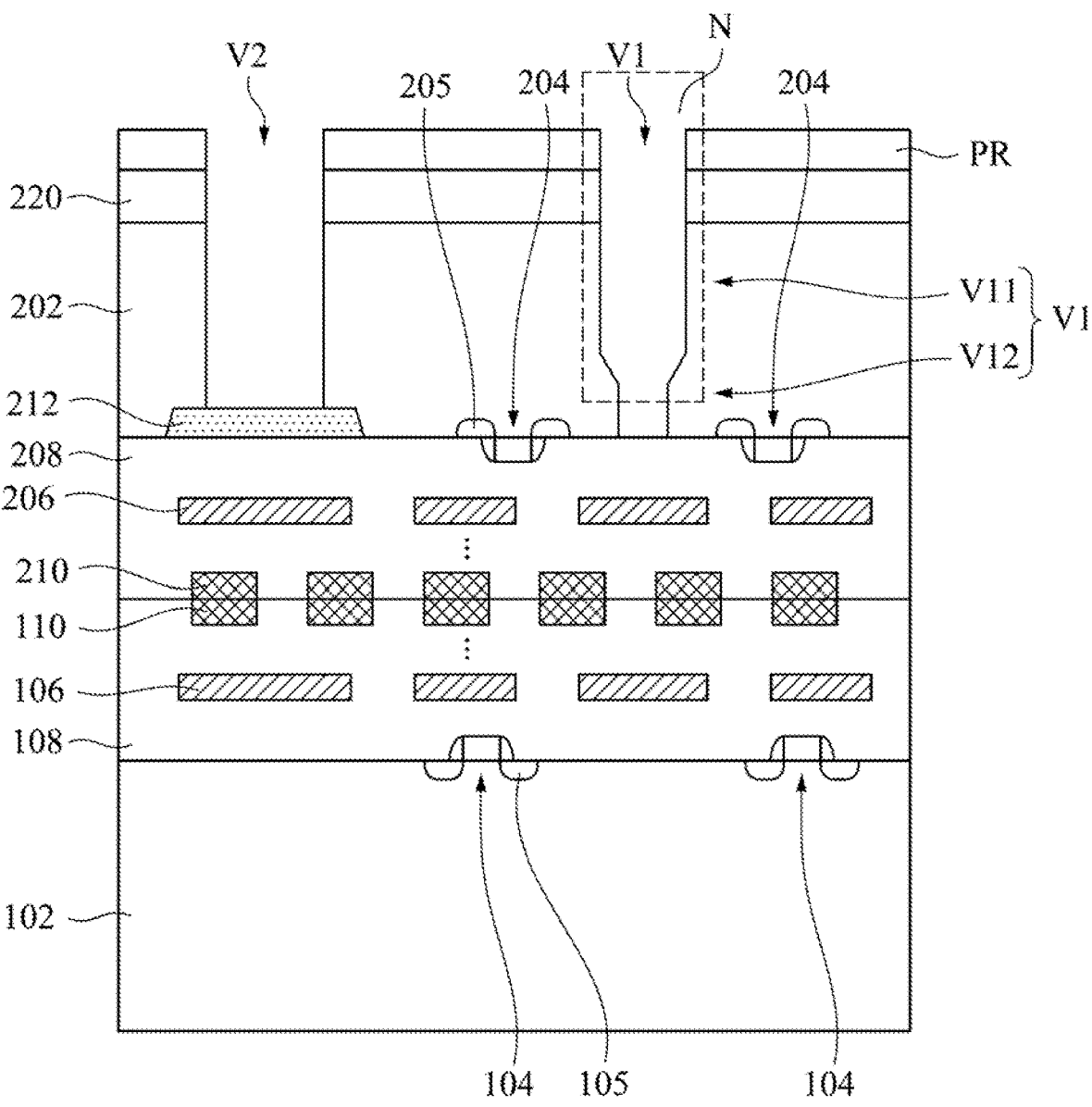
FIG. 9 illustrate cross-sectional views of intermediate stages in the manufacturing process of a semiconductor device in accordance with some embodiments of the present disclosure.

Referring to FIG. 9, a second etching process is performed such that the first via opening V1 extends to a bottom of the substrate 202. In FIG. 9, a second portion V12 of the first via opening V1 is formed. The second portion V12 of the first via opening V1 is narrower than the first portion V11 of the first via opening V1, and the reason will be explained in FIGS. 10A-10D. That is, the second via opening V2 is wider than the first portion V11 of the first via opening V1, and the first portion V11 of the first via opening V1 is wider than the second portion V12 of the first via opening V1. The narrow second portion V12 of the first via opening V1 may reduce the disturbance caused by the via subsequently formed in the first via opening V1 to the transistors 204, since the lateral distance between the transistors 204 and the first via opening V1 increases. If the first via opening V1 is formed as shown in FIG. 9, the formation of the first portion V11 may be used to reduce the loading effect during the second etching process. For example, if the width of the first via opening V1 is entirely the same as the second portion V12 of the first via opening V1, the width difference between the first via opening V1 and the second via opening V2 is so significant, such that the loading effect will be severe. If the width of the first via opening V1 is entirely same as the first portion V11 of the first via opening V1, the distance between the subsequently formed via and the transistors 204 is small. The subsequently formed via may easily affect the transistors 204 accordingly. The first etching process and the second etching process use the same etchant gas. Therefore, the depth of the second via opening V2 remains the same during the second etching process.

Figure 10A:
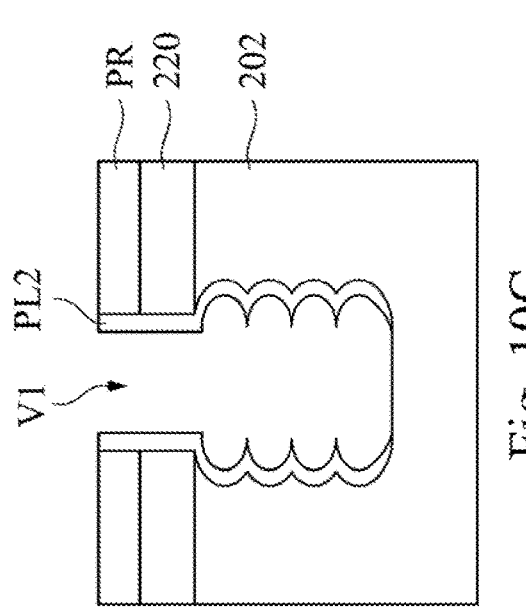
FIGS. 10A-10D illustrate a detailed mechanism of the first etching process in region N in FIG. 9.
Figure 10C:
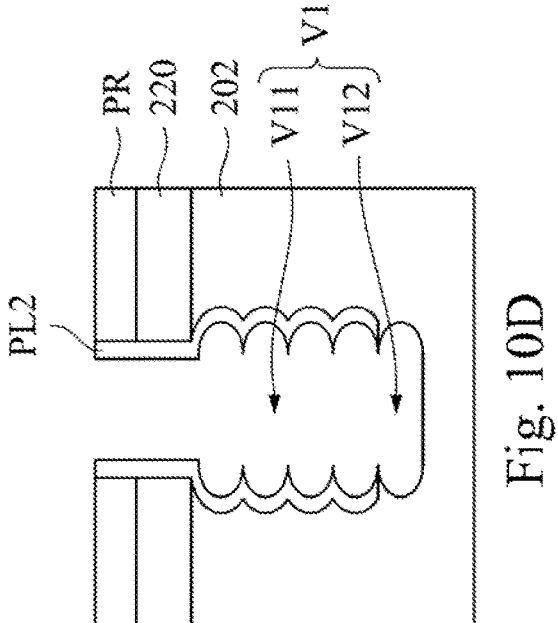
Figure 10B:
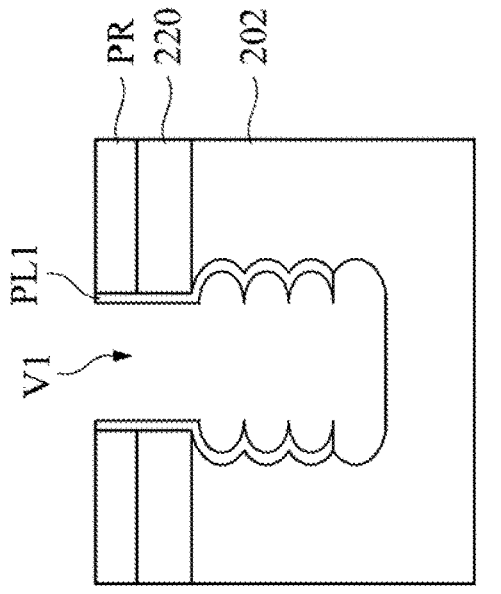
Figure 10D:
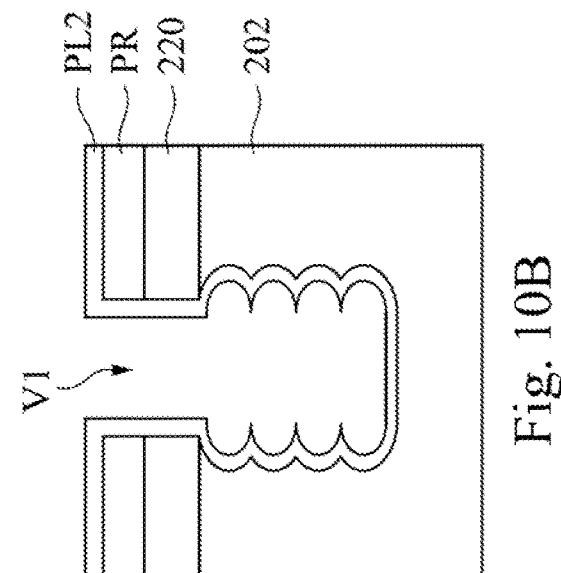

FIGS. 10A-10D illustrate a detailed mechanism of the first etching process in region N in FIG. 9. Referring to FIG. 10A, the substrate 202 is etched by the passivation layer PL along the sidewall of the first portion V11 of the first via opening V1 to form the second portion V12 of the first via opening V1 in the substrate 202. The substrate 202 may be etched by the etchant gas used in FIG. 8B. The duration of the process in FIG. 10A is short and the depth of the via opening V2 in FIG. 10A is shallow. Referring to FIG. 10B, subsequently, a passivation layer PL2 is formed along the sidewall of the dielectric layer 220 and the photoresist layer PR, and the sidewall and the bottom surface of the first via opening V1. The passivation layer PL2 may be formed by using the deposition gas used in FIG. 8C. The duration of deposition of the passivation layer PL2 is longer, such that the passivation layer PL2 is thicker than the passivation layer PL1. Referring to FIG. 10C, the passivation layer PL2 at the bottom surface of the first via opening V1 is removed by the etching gas used in FIG. 10A. Subsequently, the substrate 202 exposed at the bottom surface of the first via opening V1 is etched and the first via opening V1 is deepened. The passivation layer PL2 in may serve as a mask at the vertical sidewall of the first via opening V1, such that the first via opening V1 is etched vertically but not horizontally. Since the passivation layer PL2 is thicker than the passivation layer PL1, the width of the second portion V12 of the first via opening V1 become narrower. The etching process in FIG. 10D is same as that in FIG. 10A. Forming the passivation layer PL2, removing the passivation layer PL2 at the bottom surface of the first via opening V1 and etching the bottom surface of the first via opening V1 are repeated until the bottom of the first via opening V1 reaches the bottom of the substrate 202. Subsequently, the passivation layer PL2 is removed. It is noted that although FIGS. 8A-8E and FIGS. 10A-10D illustrate that the sidewall of the first via opening V1 is scallop-shaped, the sidewalls of the first via opening V1 and the second via opening V2 may also be straight. Further, the overall sidewall of the first via opening V1 and the overall sidewall of the second via opening V2 may also be regarded as straight as shown in FIG. 9.

Figure 11:
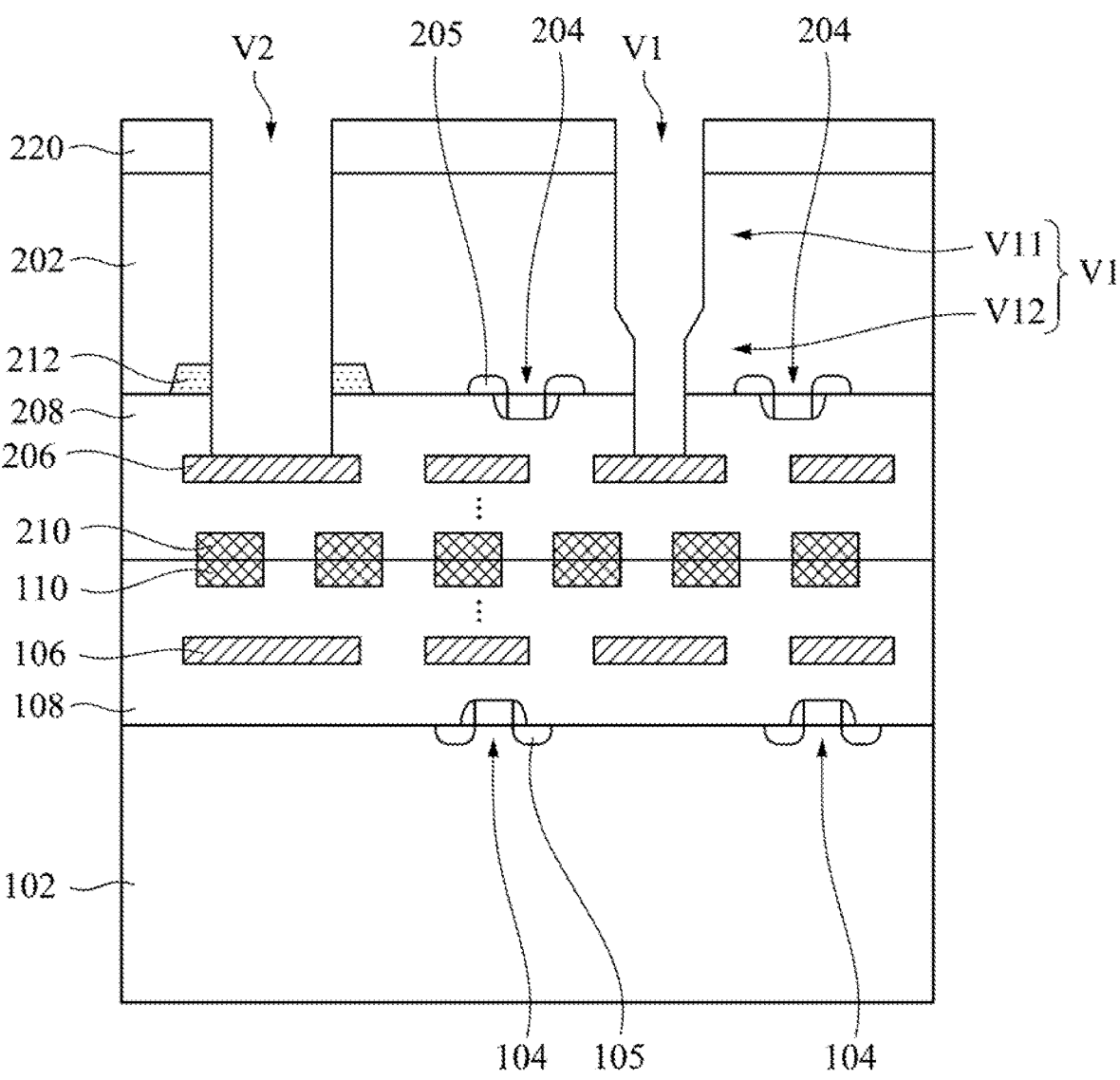
FIGS. 11-14 illustrate cross-sectional views of intermediate stages in the manufacturing process of a semiconductor device in accordance with some embodiments of the present disclosure.

Referring to FIG. 11, a third etching process is performed such that the first via opening V1 and the second via opening V2 exposes the interconnect structure 206. The second via opening V2 penetrates the isolation structure 212. Due to the existence of the isolation structure 212, the difference between etching the first via opening V1 and the second via opening V2 is reduced. More specifically, the third etching process etches the second via opening V2 at a faster rate due to the loading effect. However, the etching distance is greater for the second via opening V2. Therefore, the second via opening V2 and the first via opening V2 may reach the interconnect structure 206 substantially at the same time. Subsequently, the photoresist layer PR is stripped.

Figure 12:
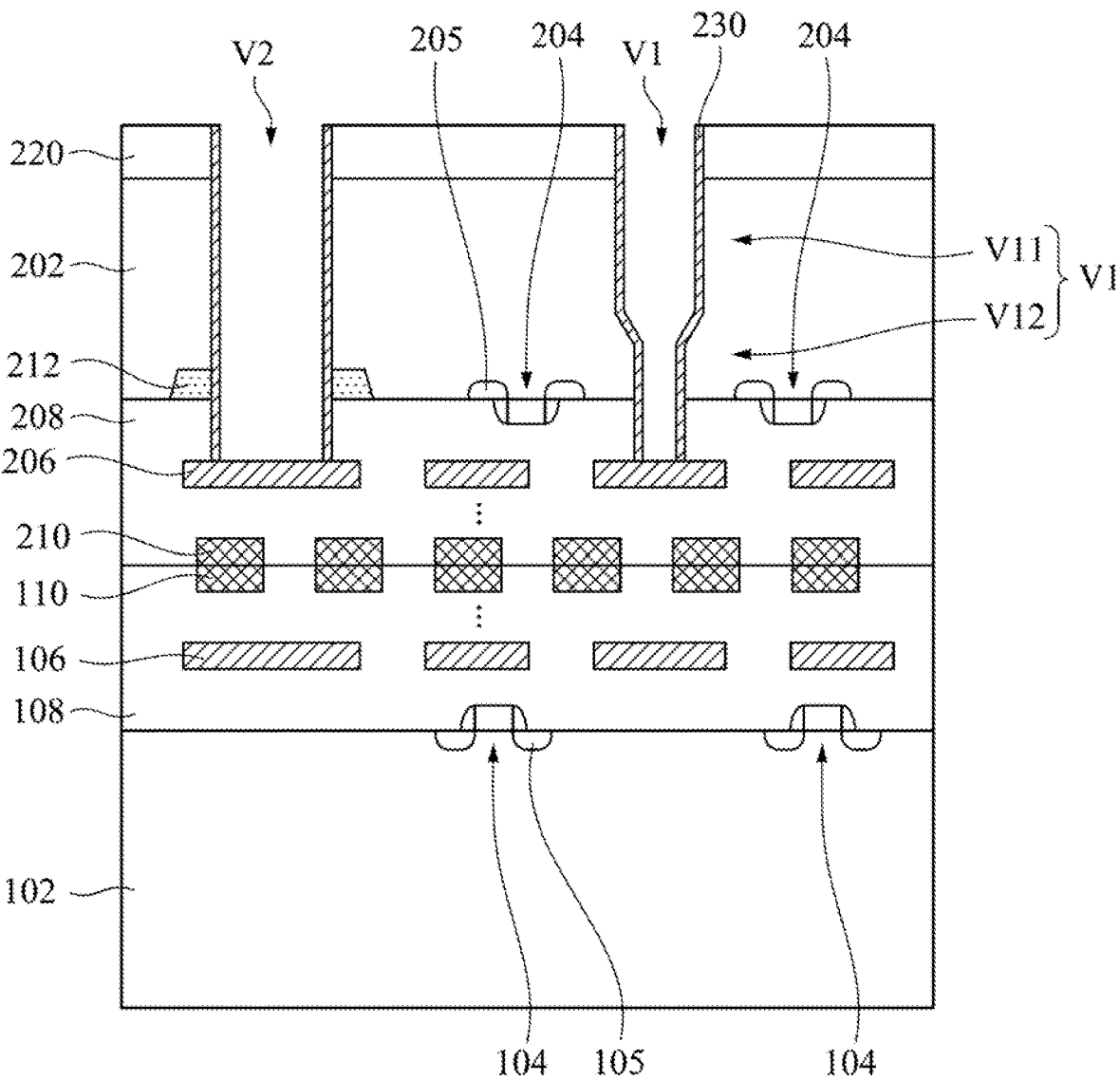

Referring to FIG. 12, liner layers 230 are formed along the sidewalls of the first via opening V1 and the second via opening V2 after performing the third etching process. In some embodiments, a dielectric layer is first conformally along the sidewalls and the bottom of the first via opening V1 and the second via opening V2, and the top surface of the dielectric layer 220. Subsequently, the dielectric layer at the bottom of the first via opening V1 and the second via opening V2, and the top surface of the dielectric layer 220 is removed to form the liner layers 230 along the sidewalls of the first via opening V1 and the second via opening V2. In some embodiments, the liner layers 230 may be any made of any suitable dielectric material, such as SiO$_2$, and the liner layers 230 may be formed by CVD, or ALD.

Figure 13:
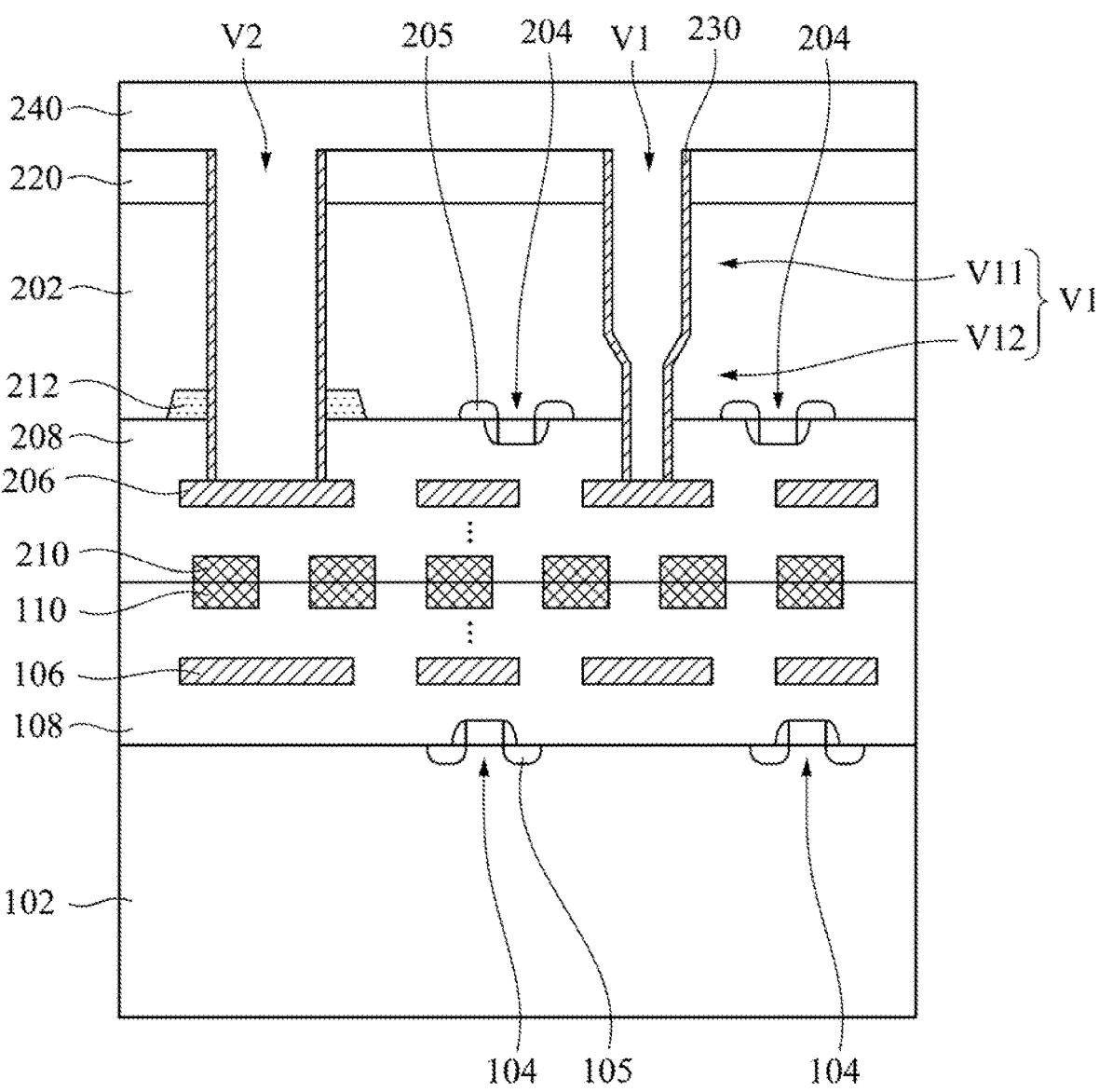
Figure 14:
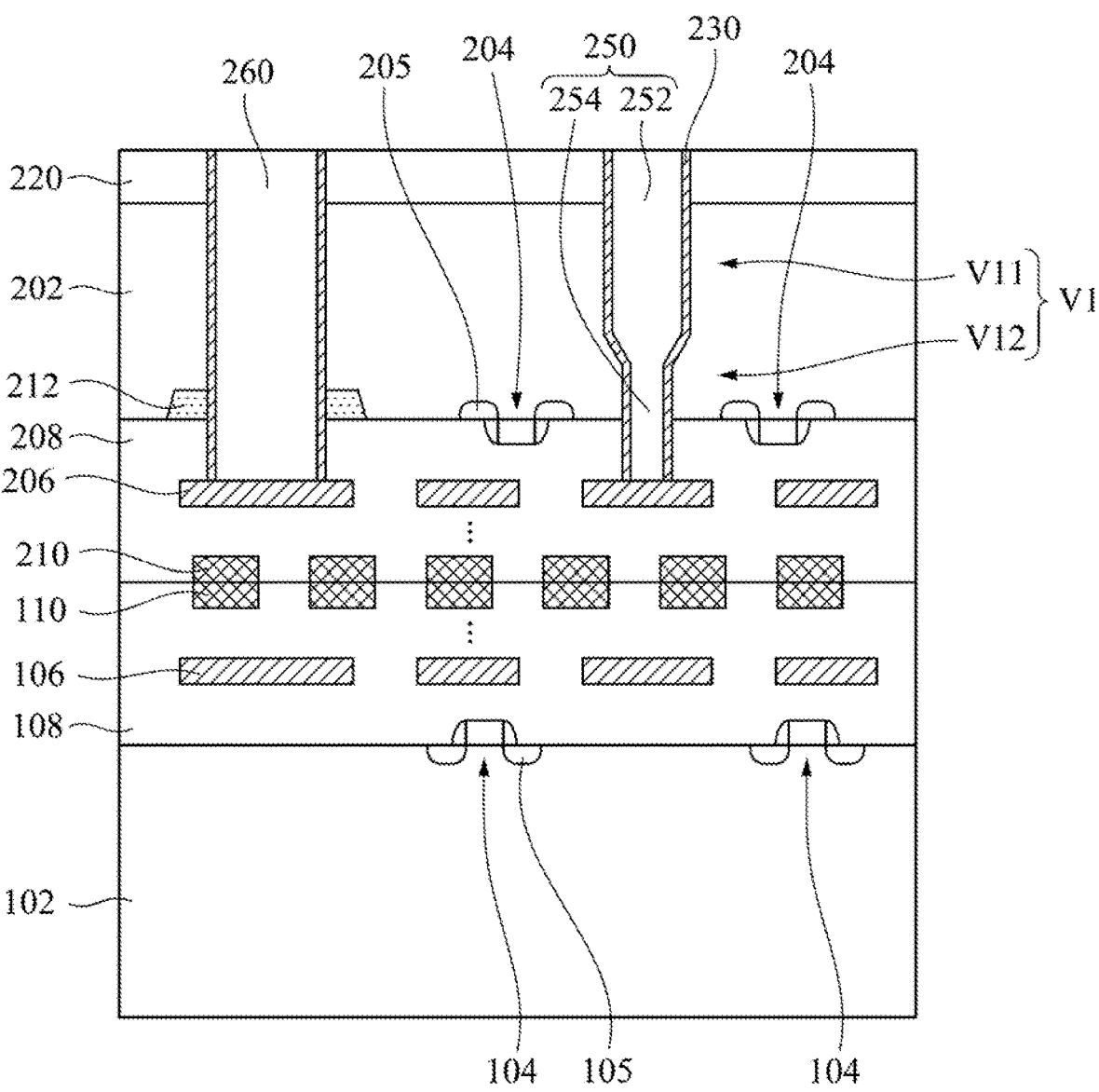

Referring to FIGS. 13-14, a first via 250 is formed in the first via opening V1 and a second via 260 is formed in the second via opening V2. More specifically, conductive materials 240 are deposited in the first via opening V1 and the second via opening V2 and over the second wafer 200. The conductive materials 240 may include barrier layers, seed layers, metal layers deposited in sequence on the sidewalls of the first via opening V1 and the second via opening V2. The conductive materials 240 may be made of TiN, TaN, Ta, Ti, Cu, combinations thereof, or the like. Subsequently, the second wafer 200 is planarized to remove an excess portion of the conductive materials 240 to form the first via 250 and the second via 260.

Figure 15:
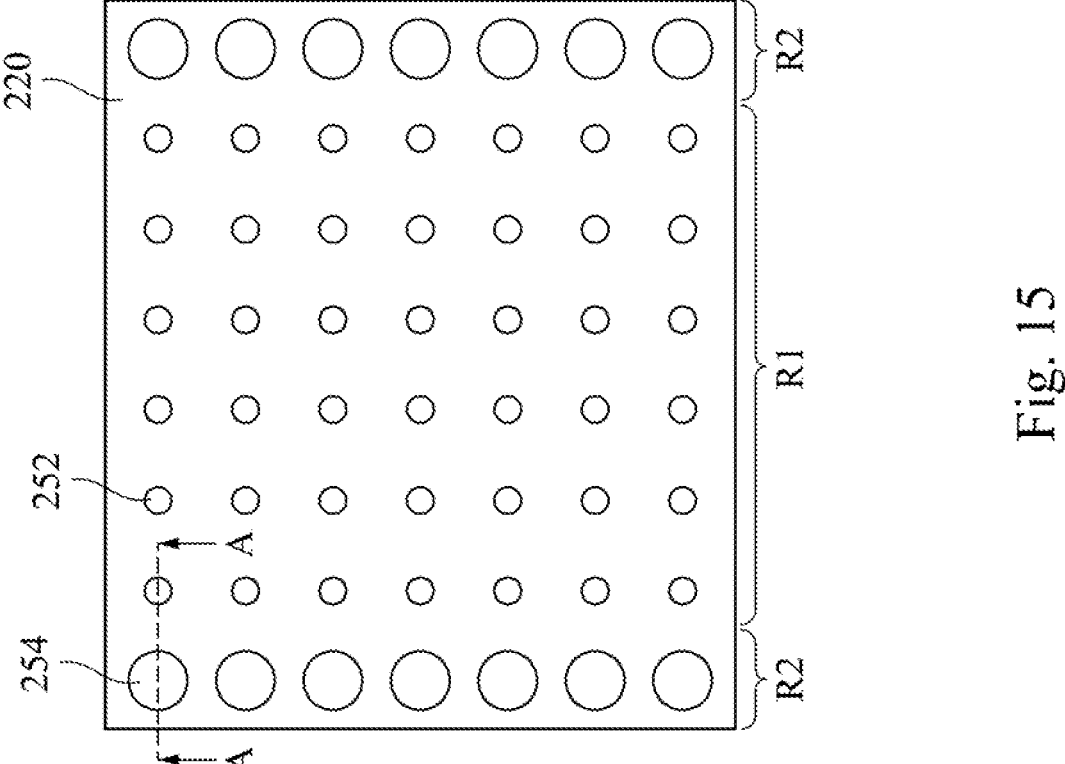
FIG. 15 illustrates a top view of a semiconductor device according to some embodiments of the present disclosure.

The resulting semiconductor device is illustrated in FIG. 14, and FIG. 15 illustrates a top view of a semiconductor device according to some embodiments of the present disclosure. FIG. 14 is a cross-section view taken along the line A-A in FIG. 15. The semiconductor device includes the first wafer 100, the second wafer 200, the first via 250 and the second via 260. The second wafer 200 is bonded to the first wafer 100, and the second wafer 200 includes the substrate 202, the isolation structure 212 embedded in the substrate 202, the transistors 204 between the substrate 202 and the first wafer 100, and the interconnect structure 206 between the transistors 204 and the first wafer 100. The transistors 204 are adjacent the isolation structure 212. That is, one of the transistors 204 is between the isolation structure 212 and another transistor 204. The first via 250 is in the central region R1 of the second wafer 200 and in contact with the interconnect structure 206. The second via 260 is in a peripheral region R2 of the second wafer 200 and in contact with the interconnect structure 206. The isolation structure 212 partially surrounds the second via 260. In FIG. 15, the first vias 250 may be arranged in an array, and the second vias 260 are arranged at the peripheral region of the array.

The first via 250 is a signal via used for signal transmission, and is between the transistor 204 and transistors but spaced apart from the isolation structure 212. The second via 260 is a power via used for power transmission (e.g., VDD and VSS), and penetrates the substrate 202 and the isolation structure 212 to the interconnect structure 206. The second via 260 is wider than the first via 250, and the first via 250 includes a first portion 252 and a second portion 254 under the first portion 252. In other words, the second portion 254 is between the first portion 252 and the interconnect structure 206, and the first portion 252 is wider than the second portion 254. The second portion 254 is narrower than the first portion 252. The narrower second portion 254 of the first via 250 may be spaced apart from the adjacent transistors 204 by a keep-out zone. If the distance between the first via 250 and the transistors 204 is less than the keep-out zone, the transistors 204 may be adversely affected by the first vias 250. Therefore, the transistors 204 in some embodiments of the present disclosure are able to be arranged more densely, since the second portion 254 of the first via 250 is formed more narrowly. Moreover, a height of the second portion 254 of the first via 250 is greater than a height of the source/drain region 205 of the transistor 204. Therefore, the wider first portion 252 of the first via 250 cannot adversely affect the transistors 204. A top of the second portion 254 is also higher than a top of the isolation structure 212.

The semiconductor device further includes liner layers 230 and the dielectric layer 220. The liner layers 230 are wrapped around the first via 250 and the second via 260, and the liner layers 230 are in contact with both the substrate 202 and the isolation structure 212. The dielectric layer 220 is over the substrate 202 and surrounds the first via 250 and the second via 260.

The manufacturing method of the semiconductor device in some embodiments of the present disclosure may control the etching rate difference of via openings with different width. For example, an isolation structure may be used as a etch stop layer for the via opening with greater width. Therefore, the etching time difference between the via openings with different width may be reduced. Moreover, the signal via in some embodiments has a narrow bottom portion. Due to the existence of the narrow bottom portion of the signal via, the transistors are less easily affected by the signal via. The transistors may be arranged densely. Therefore, the number of transistors per area increases.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising:
a first wafer;
a second wafer bonded to the first wafer, wherein the second wafer comprises:
  a substrate;
  an isolation structure embedded in the substrate;
  a transistor between the substrate and the first wafer; and
  an interconnect structure between the transistor and the first wafer;
a first via in a central region of the second wafer and in contact with the interconnect structure; and
a second via in a peripheral region of the second wafer and in contact with the interconnect structure, wherein the isolation structure partially surrounds the second via, the isolation structure is at opposite sides of the second via in a cross-sectional view, and an area of the first via interfacing with the interconnect structure is less than an area of the second via interfacing with the interconnect structure; and
a liner layer wrapped around the second via, wherein the isolation structure is in contact with a first side and a second side of the liner layer in a cross-section view, and the first side is opposite to the second side.

2. The semiconductor device of claim 1, wherein the second via is wider than the first via.

3. The semiconductor device of claim 1, wherein the first via comprises a first portion and a second portion under the first portion, and the second portion is narrower than the first portion.

4. The semiconductor device of claim 3, wherein a height of the second portion of the first via is greater than a height of a source/drain region of the transistor.

5. The semiconductor device of claim 1, wherein the liner layer is in contact with both the substrate and the isolation structure.

6. The semiconductor device of claim 1, further comprising a dielectric layer over the substrate and surrounds the first via and the second via.

7. A semiconductor device, comprising:
a first wafer;
a second wafer over the first wafer, wherein the second wafer comprises:
  a substrate;
  an isolation structure in the substrate;
  a first transistor and a second transistor adjacent the isolation structure; and
  an interconnect structure between the substrate and the first wafer;
a power via penetrating the substrate and the isolation structure to the interconnect structure, and the isolation structure is at opposite sides of the power via in a cross-sectional view; and
a signal via penetrating the substrate to the interconnect structure, wherein the signal via is between the first transistor and the second transistor but spaced apart from the isolation structure, and an area of the signal via interfacing with the interconnect structure is less than an area of the power via interfacing with the interconnect structure; and
a liner layer wrapped around the power via, wherein the isolation structure is in contact with a first side and a second side of the liner layer in a cross-section view, and the first side is opposite to the second side.

8. The semiconductor device of claim 7, wherein the signal via comprises a first portion and a second portion between the first portion and the interconnect structure, and the first portion is wider than the second portion.

9. The semiconductor device of claim 8, wherein a top of the second portion is higher than a top of the isolation structure.

* * * * *